(12) United States Patent
Sun et al.

(10) Patent No.: US 6,258,730 B1
(45) Date of Patent: Jul. 10, 2001

(54) ULTRA-THIN GATE OXIDE FORMATION USING AN $N_2O$ PLASMA

(75) Inventors: Sey-Ping Sun, Austin; Mark I. Gardner, Cedar Creek; Shengnian Song, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/246,462

(22) Filed: Feb. 9, 1999

(51) Int. Cl.$^7$ .......................... H01L 21/31; H01L 21/469
(52) U.S. Cl. .............................. 438/763; 438/513
(58) Field of Search .................... 438/243, 287, 438/435, 437, 563, 763, 513, 585, 776, 783, 787

(56) References Cited

U.S. PATENT DOCUMENTS

| | | | |
|---|---|---|---|
| 5,930,620 | * 7/1999 | Wristers et al. | 438/243 |
| 5,970,350 | * 10/1999 | Gardner et al. | 438/287 |
| 6,100,163 | * 8/2000 | Jang et al. | 438/437 |
| 6,103,601 | * 8/2000 | Lee et al. | 438/513 |

* cited by examiner

Primary Examiner—David Nelms
Assistant Examiner—Phuc T. Dang
(74) Attorney, Agent, or Firm—Kevin L. Daffer; Conley & Rose & Tayon P.C.

(57) ABSTRACT

A fabrication process for semiconductor devices is disclosed for forming ultra-thin gate oxides, whereby a silicon substrate is subjected to an $N_2O$ plasma to form the ultra-thin gate oxide. According to one embodiment, the silicon substrate is heated in a deposition chamber and the $N_2O$ plasma is created by applying RF power to a showerhead from which the $N_2O$ is dispensed. By reacting an $N_2O$ plasma directly with the silicon substrate it is possible to achieve gate oxides with thicknesses less than 20 Å and relative uniformities of less than 1% standard deviation. The oxide growth rate resulting from the presently disclosed $N_2O$ plasma treatment is much slower than other known oxide formation techniques. One advantage of the disclosed $N_2O$ plasma treatment over thermal oxidation lies in the predictability of oxide growth thickness resulting from reaction with $N_2O$ plasma versus the strong variation in oxide formation rates exhibited by thermal oxidation. Following gate oxide formation, a high temperature anneal may be performed, preferably in an RTA apparatus. By combining the $N_2O$ plasma treatment with an RTA process, the disclosed method is believed to offer a controllable and reproducible method for fabricating highly uniform, ultra-thin gate oxides, having low trapping state densities.

20 Claims, 3 Drawing Sheets

ULTRA-THIN GATE OXIDE FORMATION USING AN N₂O PLASMA

BACKGROUND OF THE INVENTION

1. Field of the Invention

This invention relates generally to fabrication of integrated circuits, and more particularly to a controllable and reproducible method for growing an ultra-thin gate oxide by directly reacting an N$_2$O plasma with a silicon substrate.

2. Description of the Related Art

MOSFETs (metal-oxide-semiconductor-field-effect transistors) are the basic building blocks of modern integrated circuits. The conventional fabrication of MOSFET devices is well known. Typically, MOSFETs are manufactured by depositing an undoped polycrystalline silicon ("polysilicon") material over a gate oxide layer arranged above a semiconductor substrate. The polysilicon material and the gate oxide layer are patterned to form a gate conductor arranged between a source region and a drain region. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET sub-threshold current can be maintained while feature sizes shrink, by decreasing any or all of several quantities, including gate oxide thickness, operating voltage, depletion width, and junction depth, by appropriate amounts.

Another factor driving reduction of gate oxide thickness is the increased transistor drain current realized for a reduced gate dielectric thickness. Higher transistor drain currents are desirable because they allow each transistor to drive a greater number of other transistors, and can result in increased switching speeds. The transistor drain current is proportional to the amount of charge induced in the transistor channel region by the voltage applied to the gate conductor. The amount of charge induced by a given voltage drop across the gate oxide is the voltage drop multiplied by the capacitance of the oxide. Increasing the capacitance of the oxide therefore increases the transistor drain current. The capacitance C of the oxide can be written as for a parallel plate capacitor:

$$C = \epsilon A / t_{ox},$$

where $\epsilon$ is the permittivity of the oxide, A is its area, and $t_{ox}$ is the oxide thickness. It can be seen that reducing oxide thickness increases the oxide capacitance and thereby the drive current of a transistor.

A gate oxide is typically grown onto the upper surface of a silicon substrate by heating the substrate to a temperature greater than about 700° C. in an oxidizing ambient. Such thermal oxides have been traditionally preferred over deposited oxides because thermal oxides generally exhibit lower trap state densities within the oxide and at the silicon/oxide interface. Trap states are energy levels, typically associated with impurities or defects, that can trap electrons or holes at the location of the impurity or defect. "Hot" carriers, or carriers that attain high kinetic energy (typically from the electric field moving them along a transistor channel), are particularly susceptible to being injected into the oxide and captured by trap states there. If a sufficiently high density of trap states is associated with an oxide, charge may build up in the oxide as carriers become trapped. This can lead to shifts in the transistor threshold voltage with time.

Although thermal oxides are attractive because of the low trap densities associated with them, growth of very thin thermal oxides (i.e., less than about 100 angstroms thick) does present difficulties. For example, the growth rate of a thermal oxide is dependent on oxide thickness for a given set of growth conditions. In particular, the growth rate is more rapid during the initial stages of growth than it is after growth of approximately 300 angstroms of oxide. Initial-stage oxide growth can be modeled using a growth rate that decreases exponentially with increasing thickness. This strong variation of growth rate for low oxide thicknesses makes it difficult to grow controllable, reproducible oxides with thicknesses of less than about 50 angstroms. Another problem associated with a strongly varying growth rate is an inability to produce highly uniform gate oxide thicknesses (i.e., less than 1% standard deviation).

Yet another problem with growing very thin oxides is that roughness, contamination, and imperfections in the starting silicon surface become increasingly important to the integrity of the grown oxide. Any locally weak or excessively thin spots may become preferred sites for breakdown of the oxide when exposed to electric fields during device operation. Breakdown is a potential problem with very thin oxides, whether they are grown or deposited, and may be precipitated by physical defects such as pinholes or thin areas. Trap states within the oxide may also lead to breakdown, by trapping charge, which causes locally elevated electric fields. Tunneling current through the oxide may be locally increased as a result of such an elevated field, leading to breakdown.

It would therefore be desirable to develop a method for controllable, reproducible formation of uniform, ultra-thin (less than about 20 Å thick) gate oxides. The desired gate oxide should be breakdown-resistant and substantially free of trap states that may cause $V_T$ shifts.

SUMMARY OF THE INVENTION

The problems outlined above are overcome by subjecting a silicon substrate to an N$_2$O plasma to form an ultra-thin gate oxide. By reacting an N$_2$O plasma directly with the silicon substrate it is possible to achieve gate oxides with thicknesses less than 20 Å and relative thickness uniformities of less than 1% standard deviation (measured as a percentage of the oxide thickness). A subsequent high temperature anneal may then be performed to reduce the density of trapping states. In this manner, the disclosed method offers a means for controllably and reproducibly forming uniform, ultra-thin gate oxides that are resistant to breakdown.

Broadly speaking, a method is contemplated for forming an ultra-thin gate oxide by reacting an N$_2$O plasma directly with a silicon substrate. A silicon substrate is provided, which preferably includes monocrystalline silicon. An RCA cleaning may be performed to reduce roughness, imperfections, and contaminants that may be present in the surface of the silicon substrate. In addition, a cleaning may be advantageously employed to remove any native oxide layer that may have formed upon the silicon substrate. According to an embodiment, formation of an ultra-thin gate oxide includes placing the silicon substrate into a reaction chamber, ideally a deposition chamber of a type used in plasma enhanced chemical vapor deposition (PECVD). The deposition temperature is preferably between about 350° C. and about 450° C., and more preferably between about 390° C. and about 410° C. Once the temperature in the deposition chamber reaches a desired level, $N_2O$ may be flowed above the silicon substrate, preferably through a showerhead positioned above the silicon substrate. The $N_2O$ flow rate is preferably between about 600 sccm and about 800 sccm, and the chamber pressure is preferably between about 2.2 torr and about 2.6 torr. High frequency RF power may then applied to the deposition chamber to create an $N_2O$ plasma, preferably at a frequency of approximately 13.56 MHz.

The above $N_2O$ plasma treatment is continued until a desired oxide thickness is achieved. One advantage of the present method over thermal oxidation lies in the predictability of oxide growth thickness resulting from reaction with $N_2O$ plasma versus the strong variation in oxide formation rates exhibited by thermal oxidation.

Another embodiment contemplates performing an anneal subsequent to growing the ultra-thin gate oxide. An anneal involves heating substrate 10 in a nitrogen-bearing ambient to an anneal temperature greater than about 800° C. for a time less than about 5 minutes. An anneal is preferably performed using an RTA apparatus which allows rapid heating and cooling of the substrate. In a preferred embodiment, the anneal temperature is between 850° C. and 1000° C., and the anneal time is between about 30 seconds and about 2 minutes.

Formation of a gate oxide using the disclosed method offers numerous advantages over prior gate oxide techniques. Thermal oxidation exhibits a strongly varying oxide growth rate for thin films, which makes it difficult to grow oxides with thicknesses of less than about 20 Å in a controllable, reproducible manner. Using the disclosed $N_2O$ plasma treatment, it is possible to reliably produce gate oxides with thicknesses less than 20 Å and relative uniformities of less than 1% standard deviation. One of the primary benefits of performing an anneal subsequent to the $N_2O$ plasma treatment is in the reduction of the density of interface trap states. As discussed above, one of the advantages of thermal oxidation is a relatively low trapping state density. By combining the $N_2O$ plasma treatment with an RTA process, the disclosed method is believed to offer a controllable and reproducible method for fabricating highly uniform, ultra-thin gate oxides, having low trapping state densities.

BRIEF DESCRIPTION OF THE DRAWINGS

Other objects and advantages of the invention will become apparent upon reading the following detailed description and upon reference to the accompanying drawings in which.

Figure 1:
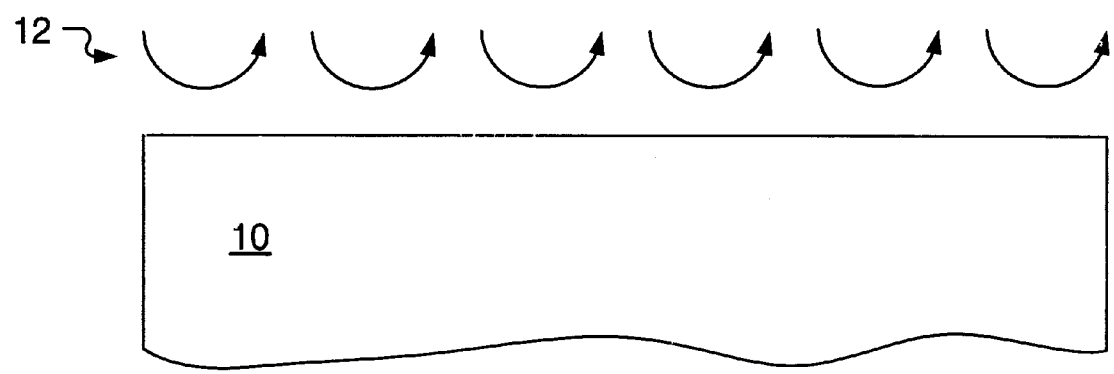
FIG. 1 is a partial cross-sectional view of a semiconductor topography of a preferred embodiment, wherein a silicon substrate is cleaned.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 shows silicon substrate 10 undergoing cleaning procedure 12. A suitable material for silicon substrate 10 is lightly doped p-type or n-type single crystal silicon. Alternatively, substrate 10 may be an epitaxial silicon layer grown on a monocrystalline silicon substrate, or an n-type or p-type well region formed in a monocrystalline silicon substrate. In yet another alternative, substrate 10 may be an epitaxial silicon layer formed upon an insulating layer on a semiconductor substrate. Although not shown, there may be dielectric isolation regions formed within substrate 10 to prevent electrical interaction between subsequently-formed semiconductor devices. Methods of forming isolation regions in a silicon substrate are well known, including dielectric deposition to fill trenches etched into the substrate and local oxidation of silicon.

Prior to forming an ultra-thin gate oxide, as described below, the upper surface of substrate 10 should be carefully cleaned in order to remove contaminants from and reduce elevational disparitites in the surface of substrate 10. Oxides subsequently formed on a rough silicon surface are generally of a lower quality than oxides grown under identical conditions on a smoother silicon surface. Therefore, it is advantageous to thoroughly clean the upper surface of substrate 10, in order to maximize the relative uniformity of a subsequently grown ultra-thin gate oxide. Cleaning procedure 12 may be employed for this purpose. Cleaning procedure 12 is preferably an RCA clean. RCA cleans are generally well known in the semiconductor processing arts and typically involve oxidation of a silicon substrate in solutions which combine either an acid or a base with hydrogen peroxide, and subsequent removal of the oxide using a hydrofluoric acid (HF) solution.

Cleaning procedure 12 may also be used to remove any native oxide that may have formed upon the silicon substrate. When exposed to an oxidizing ambient (e.g., $O_2$ in air) a very thin (less than 20 Å) oxide layer may form on freshly cleaved silicon. Such a native oxide layer may form at room temperatures, with oxide thickness increasing with temperature. Since native oxide thickness may be on the order of the desired gate oxide thickness, it may be advantageous to remove any native oxide layer prior to gate oxide formation.

Figure 2:
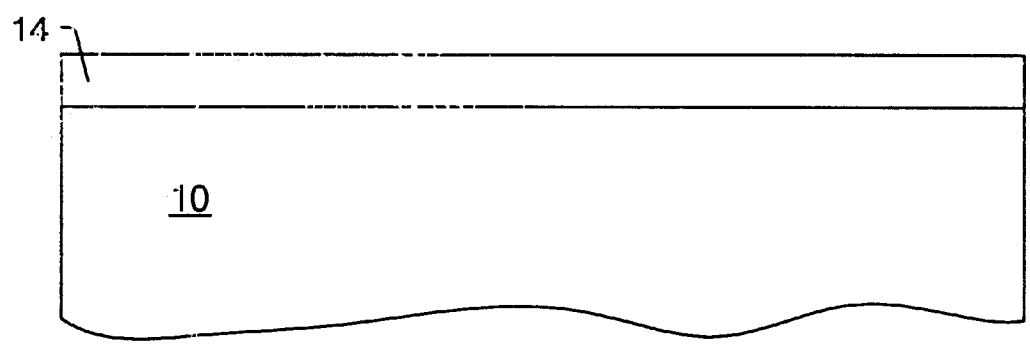
FIG. 2 is a partial cross-sectional view of the semiconductor topography wherein an ultra-thin gate dielectric is formed over the silicon substrate.

FIG. 2 depicts a processing step initiated subsequent to cleaning the upper surface of substrate 10 in which ultra-thin gate oxide 14 is grown. Gate oxide 14 is preferably formed by flowing an $N_2O$ source gas into a plasma enhanced chemical vapor deposition ("PECVD") tool. The resultant $N_2O$ plasma reacts directly with silicon substrate 10. As Si in the substrate reacts with the $N_2O$ plasma, it is consumed to form $SiO_2$ The reaction continues as $N_2O$ diffuses through the initial $SiO_2$ to react with the underlying substrate. PECVD uses an RF-induced glow discharge to transfer energy to the source gas, thereby permitting deposition temperatures lower than those utilized in other CVD techniques and thermal oxidation.

Formation of gate oxide 14 begins with placing substrate 10 into a reaction chamber, ideally a deposition chamber of a type commonly used in PECVD. The deposition chamber is preferably a component of a cluster tool, which will allow subsequent processing steps, such as gate conductor formation, to be carried out without contamination from room air exposure. The deposition chamber can also form part of a cluster tool with the clean chamber occurring prior to deposition. The deposition temperature is preferably between about 350° C. and about 450° C., and more preferably between about 390° C. and about 410° C. Once the temperature in the deposition chamber reaches the desired level, $N_2O$ may be flowed through a showerhead positioned above substrate 10. Application of high frequency RF power to the showerhead initiates oxide growth by creating an $N_2O$ plasma that directly reacts with the silicon in substrate 10 to form silicon oxide.

The above $N_2O$ plasma treatment is continued until a desired oxide thickness is achieved. The desired thickness will depend on the design rules employed for the semiconductor device being fabricated. One advantage of the present method over thermal oxidation lies in the predictability of oxide growth thickness resulting from reaction with $N_2O$ plasma versus the strong variation in oxide formation rates exhibited by thermal oxidation. The disparity in oxidation rates is most acute for ultra-thin oxides (i.e., oxide thickness less than 20 Å). According to the present method, the oxide growth rate is approximately linear for $N_2O$ plasma times of less than approximately 10 seconds. As will be seen below, the oxide growth rate resulting from the presently disclosed $N_2O$ plasma treatment is much slower than other known oxide formation techniques. One advantage of the slow oxide growth rate achievable using the method disclosed herein is increased control over the thickness of an oxide, such as gate oxide 14. Another advantage that will become apparent is greater uniformity in the thickness of the gate oxide.

In an exemplary process, ultra-thin gate oxides were grown using the above technique with thicknesses less than 20 Å and relative thickness uniformities (as measured in discrete areas less than a micron) of less than 2% standard deviation and, in many instances less than 1% standard deviation. Measuring of such small areas in numerous locations across the gate dielectric yields the desired standard deviation. Suitable $N_2O$ flow rates include between about 600 sccm and about 800 sccm, with the chamber pressure ideally being in the range between about 2.2 torr and about 2.6 torr. The RF power was applied at a frequency of 13.56 MHz at a level of approximately 700–800 W. Experimental results corresponding to an exemplary embodiment of the disclosed $N_2O$ plasma treatment are presented in Table 1.

TABLE 1

| $N_2O$ Plasma Time (sec) | Thickness (Å) | % STD |
| --- | --- | --- |
| 2 | 12.24 | 1.288 |
| 3 | 13.76 | 1.487 |
| 4 | 14.6 | 1.59 |
| 6 | 16.11 | 1.613 |
| 12 | 17.79 | 0.897 |
| 18 | 18.97 | 0.525 |
| 24 | 19.86 | 1.011 |
| 30 | 20.64 | 0.898 |
| 60 | 23.28 | 1.15 |
| 90 | 25.1 | 1.457 |
| 120 | 27.45 | 2.568 |

Figure 3:
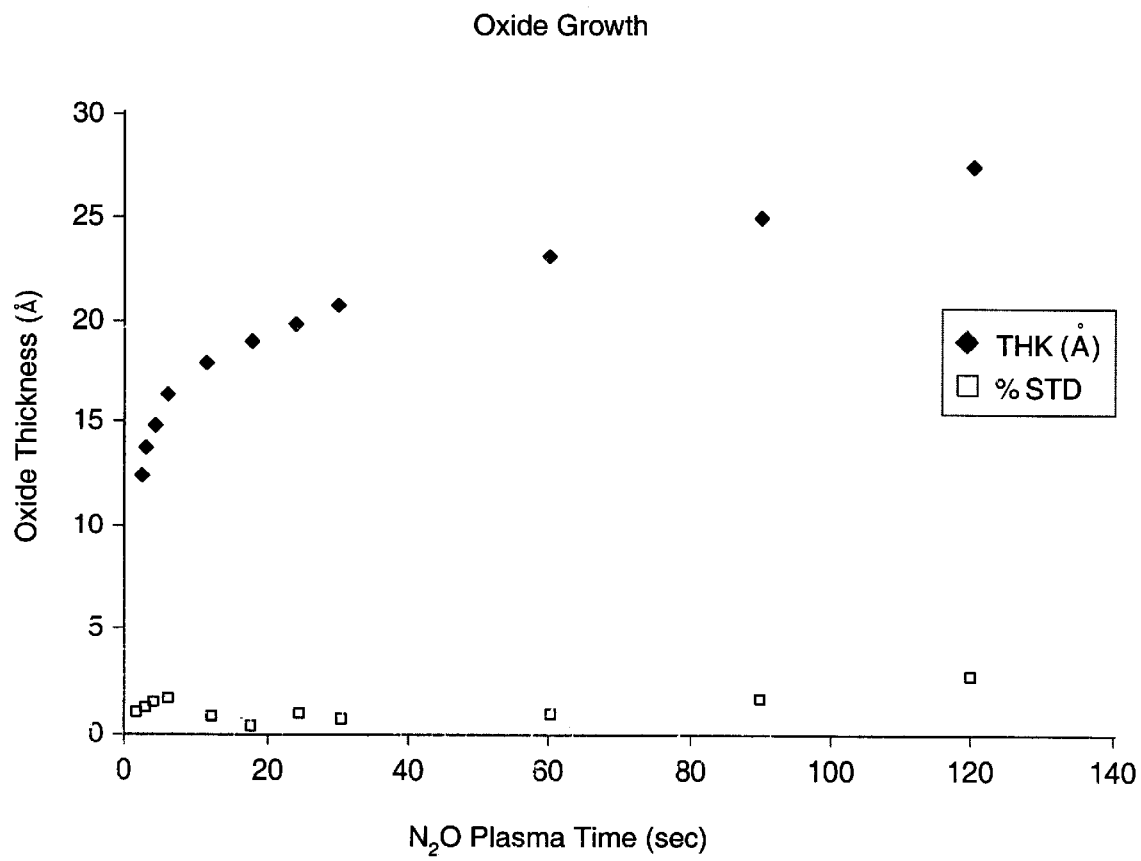
FIG. 3 is a graph showing oxide thickness and relative uniformity achieved herein as plotted against $N_2O$ plasma time.

FIG. 3 plot the results of Table 1, graphically representing oxide thickness as a function of $N_2O$ plasma time (i.e., the exposure time to the $N_2O$ plasma). The deposition chamber used for this experiment was a Sequel model chamber manufactured by Novellus. Values for various control parameters used to obtain the desired surface smoothness and thickness uniformity are listed in Table 2.

TABLE 2

| Chamber Pressure | 2.4 torr |
| --- | --- |
| Deposition Temperature | 400° C. |
| $N_2O$ Flow Rate | 700 sccm |
| RF Power | 750 W |

The slow oxide growth rate corresponding to the $N_2O$ plasma treatment (i.e., direct reaction of an $N_2O$ plasma with a silicon substrate to form a gate oxide) is apparent in FIG. 3. One of the primary benefits of a slow oxide growth rate is a high degree of control over the thickness of a growing oxide, such as gate oxide 14. Increased control and improved reproducibility distinguish the disclosed method for growing an oxide over other prescriptions for forming oxides. For example, thermal oxidation is especially unsuitable for thin film growth. Thermal oxidation exhibits a strongly varying oxide growth rate for thin films, which makes it difficult to grow oxides with thicknesses of less than about 50 Å in a controllable, reproducible manner. The oxide growth rate for the $N_2O$ plasma treatment described above is also slower than other alternatives to thermal oxidation.

One recent alternative to thermal oxidation utilizes a low-power, low-pressure PECVD deposition of SiO2 from a reaction of silane ($SiH_4$) and $N_2O$. Aside from lower oxide growth rate, the presently disclosed $N_2O$ plasma treatment offers a number of advantages over the low-power, low-pressure PECVD method. First, according to the present method, $N_2O$ reacts directly with the silicon substrate. This is not the case in the low-power, low-pressure PECVD method, where $N_2O$ reacts primarily with silane. Second, oxide formation in the present method results from growth (i.e., consumption of the silicon substrate as Si in the substrate reacts with the $N_2O$ plasma). In contrast, the oxide formation mechanism in the low-power, low-pressure PECVD method involves deposition of the $SiO_2$ product from the reaction of $SiH_4$ and $N_2O$. Third, $H_2$ produced by the $SiH_4/N_2O$ reaction may affect device performance if the hydrogen diffuses to the silicon/oxide interface near the channel region. Hydrogen in dielectrics is believed to contribute to hot-electron effects in transistors by increasing the density of available trap states that can be occupied by hot electrons injected into a dielectric. Hydrogen diffuses rapidly in oxide, and so can diffuse to silicon/oxide interfaces near the transistor channel where it may disrupt the pre-existing bonds. Although dangling bonds may be terminated with silicon-hydrogen bond formation, silicon-hydrogen bonds are weak and can easily be broken by injected hot electrons. In this way, hydrogen may exacerbate hot-electron effects. A reduction in hydrogen incorporation into an oxide is therefore believed to reduce trap state densities and mitigate hot-electron effects. While the oxide growth rate of the low-power, low-pressure PECVD method is postulated to be slow enough to avoid hydrogen being buried in the $SiO_2$ film, the absence of hydrogen byproducts in the present method ensure against hydrogen finding its way into the gate oxide.

Also apparent from FIG. 3 and Table 1 is the high uniformity of oxide thickness achievable with the disclosed method. As the vertical dimension of gate oxides continue to shrink, the need for increased uniformity rises. Any locally weak or excessively thin spots may become preferred sites for breakdown of the oxide when exposed to electric fields during device operation. Breakdown is a potential problem with very thin oxides, whether they are grown or deposited, and may be precipitated by physical defects such as pinholes or thin areas. According to the disclosed method, gate oxides may be fabricated having less than 1% standard deviation.

Figure 4:
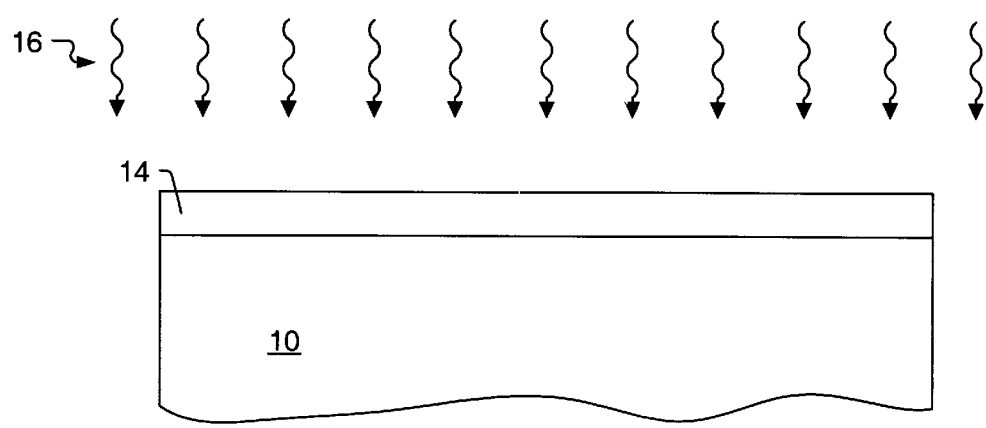
FIG. 4 is a partial cross-sectional view of the semiconductor topography being annealed.

FIG. 4 illustrates a further step that may be incorporated into a preferred process flow wherein anneal 16 is performed on substrate 10 and gate oxide 14. One advantage of anneal 16 is a reduction in trapping states. Anneal 16 involves heating substrate 10 in a nitrogen-bearing ambient to an anneal temperature between about 800° C. and about 1200° C. for a time less than about 5 minutes. In a preferred embodiment, the anneal temperature is between 850° C. and 1000° C., and the anneal time is between about 30 seconds and about 2 minutes. In the exemplary embodiment described above, an anneal temperature of 950° C. was maintained for 30 seconds. Anneal 16 is preferably performed using an RTA apparatus which allows rapid heating and cooling of the substrate (heat and cool times of a few seconds or less). RTA equipment typically includes lamps that provide radiant heating of the substrate and a low-thermal-mass substrate holder. In a preferred embodiment, anneal 16 is performed in such a way that gate oxide 14 is not exposed to room air. This may be achieved, for example, by carrying out anneal 16 in an additional chamber which is linked to the oxide deposition chamber as part of a cluster tool. Nitrogen-bearing ambients suitable for anneal 16 include $N_2$ and $NH_3$, among other nitrogen-containing gases. If a more reactive gas such as $NH_3$ is used, some nitrogen may be incorporated into gate oxide 14 during anneal 16. However, this may be advantageous by increasing the resistance of gate oxide 14 to impurity diffusion. Application of anneal 16 to gate oxide 14 may improve the interface between oxide 14 and substrate 10 by, for example, reducing the density of interface trap states.

Figure 5:
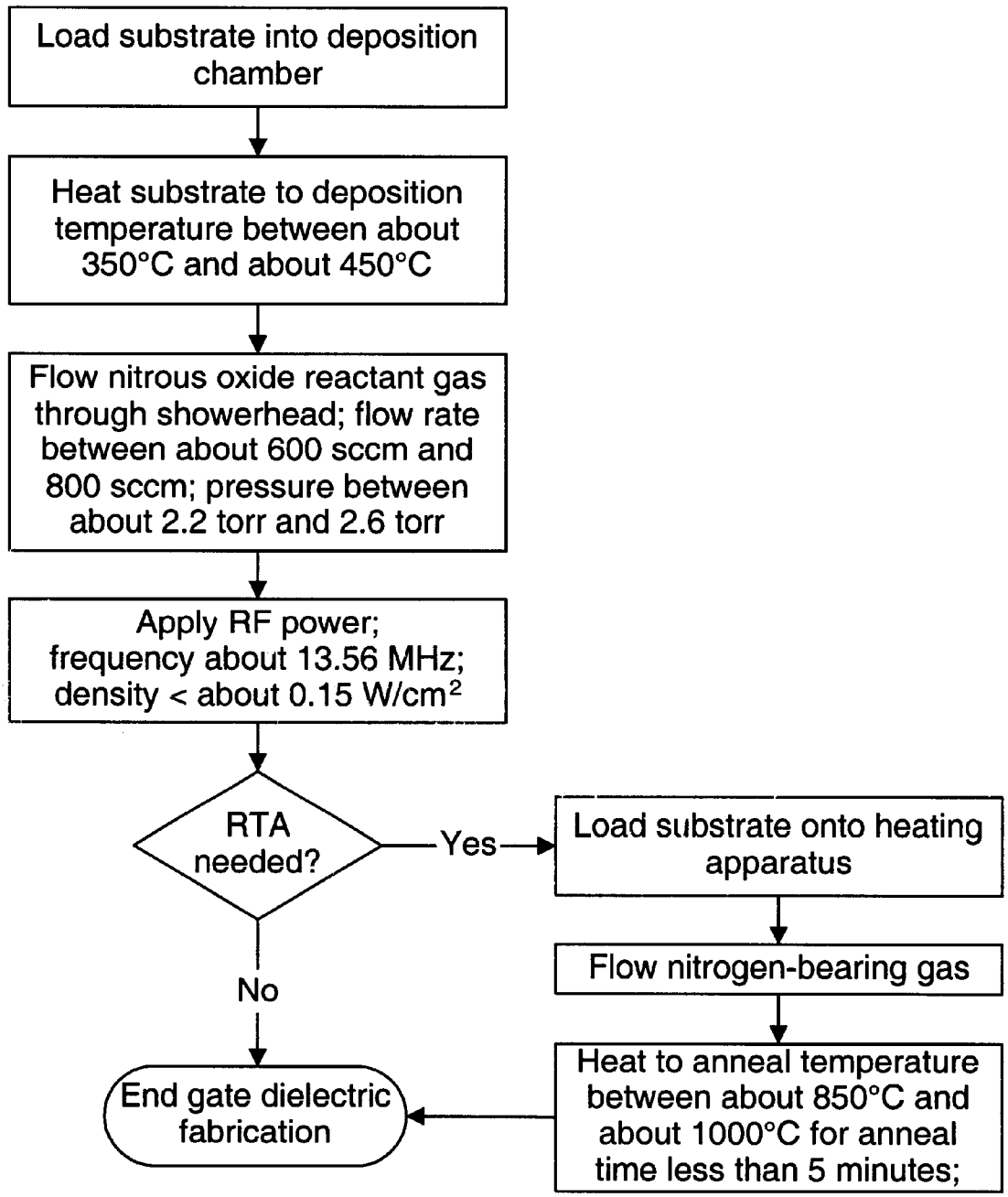
FIG. 5 is a flowchart illustrating a process sequence for an embodiment of the method recited herein.

FIG. 5 presents a flowchart illustrating an embodiment of the disclosed method. To perform the process recited herein for ultra-thin gate oxide formation on a substrate such as substrate 10 of FIG. 1, substrate 10 may be loaded onto a mounting position of a deposition chamber. As described in the flowchart of FIG. 5, the substrate is heated to a deposition temperature between about 350° C. and about 450° C., and $N_2O$ is flowed above the substrate, preferably through a showerhead located in the deposition chamber. As noted above, suitable $N_2O$ flow rates are between about 600 and about 800 sccm, and the pressure within the chamber is maintained between about 2.2 and 2.6 torr. RF power is applied to the deposition chamber such that an RF power density of less than 0.15 $W/cm^2$ is established over the substrate. The RF power is preferably applied to the showerhead. With the application of this RF power, an ultra-thin gate oxide layer such as gate oxide 14 of FIG. 2 occurs.

The resultant ultra-thin gate oxide may be subsequently annealed, as shown in the flowchart of FIG. 5. This anneal cycle is preferably performed in a chamber attached to the deposition chamber, though it may be possible to perform it in the deposition chamber. As noted above, the anneal entails heating the substrate and gate oxide grown thereon in a nitrogen-bearing ambient to an anneal temperature between about 800° C. and about 1200° C. for a time less than about 5 minutes, and preferably between 850° C. and 1000° C.

After the formation and optional annealing of gate oxide 14 as described above, further device fabrication may be undertaken. This fabrication generally includes formation of a gate conductor above the gate oxide. Gate conductor fabrication is preferably performed within the same cluster tool as is used for the gate oxide formation, again so that contamination from room air exposure is avoided.

It will be appreciated by those skilled in the art having the benefit of this disclosure that the disclosed method is believed to be capable of forming highly uniform, ultra-thin gate oxides. Furthermore, it is also to be understood that the form of the invention shown and described is to be taken as exemplary, presently preferred embodiments. Various modifications and changes may be made to each and every processing step without departing from the spirit and the scope of the invention as set forth in the claims. It is intended that the following claims be interpreted to embrace all such modifications and changes and, accordingly, the specification and drawings are being regarded in an illustrative rather than a restrictive sense.

What is claimed is:

1. A method for forming a gate oxide for a semiconductor device, comprising reacting an $N_2O$ plasma directly with a silicon substrate to form an ultra-thin gate oxide.

2. The method of claim 1, further comprising:
   placing said silicon substrate in a reaction chamber; and
   heating said silicon substrate to a temperature between approximately 350° C. and approximately 450° C.

3. The method of claim 2, wherein said reaction chamber is a deposition chamber.

4. The method of claim 2, wherein said reacting comprises:
   flowing $N_2O$ above the silicon substrate such that a pressure in the deposition chamber is between approximately 2.2 torr and approximately 2.6 torr; and
   applying RF power to the reaction chamber to form said $N_2O$ plasma.

5. The method of claim 4, wherein said flowing comprises using an $N_2O$ flow rate between approximately 600 sccm and approximately 800 sccm.

6. The method of claim 4, wherein said applying RF power comprises using a frequency of approximately 13.56 MHz.

7. The method of claim 4, wherein said flowing comprises directing said $N_2O$ through a showerhead positioned above the silicon substrate.

8. The method of claim 4, further comprising maintaining said silicon substrate in a nitrogen-bearing ambient at an anneal temperature between approximately 800° C. and approximately 1200° C. for an anneal time less than 5 minutes, subsequent to said applying RF power.

9. The method of claim 7, wherein said nitrogen bearing ambient comprises nitrogen.

10. The method of claim 7, wherein said nitrogen bearing ambient comprises ammonia.

11. The method of claim 2, wherein said silicon substrate is cleaned using an RCA technique prior to said placing.

12. A method for forming a gate oxide for a semiconductor device, comprising:
heating a silicon substrate to a temperature between approximately 350° C. and approximately 450° C. in a reaction chamber;
flowing $N_2O$ above said silicon substrate such that the pressure in said reaction chamber is between approximately 2.2 and approximately 2.6 torr; and
applying an RF power to the reaction chamber, whereby an $N_2O$ plasma is formed that reacts directly with the silicon substrate.

13. The method of claim 12, wherein said reaction chamber is a deposition chamber.

14. The method of claim 12, wherein said flowing comprises using an $N_2O$ flow rate between approximately 600 sccm and approximately 800 sccm.

15. The method of claim 12, wherein said applying RF power comprises using a frequency of approximately 13.56 MHz.

16. The method of claim 12, wherein said flowing comprises directing said $N_2O$ through a showerhead positioned above the silicon substrate.

17. The method of claim 12, further comprising maintaining said silicon substrate in a nitrogen-bearing ambient at an anneal temperature between approximately 800° C. and approximately 1200° C. for an anneal time less than 5 minutes, subsequent to said applying RF power.

18. The method of claim 12, wherein said silicon substrate is cleaned using an RCA technique prior to said heating.

19. The method of claim 1, wherein a thickness of said ultra-thin gate oxide comprises less than approximately 20 angstroms.

20. The method of claim 19, wherein a standard deviation of the thickness is less than approximately 1%.

* * * * *